US012738466B2

(12) United States Patent
Maier

(10) Patent No.: US 12,738,466 B2
(45) Date of Patent: Sep. 15, 2026

(54) SIGNAL PROCESSING SYSTEM AND POWER SUPPLY DEVICE HAVING A SIGNAL PROCESSING SYSTEM

(71) Applicant: TRUMPF Huettinger GmbH + Co. KG, Freiburg (DE)

(72) Inventor: Florian A. Maier, Pfaffenweiler (DE)

(73) Assignee: TRUMPF HUETTINGER GMBH + CO. KG, Freiburg (DE)

(*) Notice: Subject to any disclaimer, the term of this patent is extended or adjusted under 35 U.S.C. 154(b) by 186 days.

(21) Appl. No.: 18/533,220

(22) Filed: Dec. 8, 2023

(65) Prior Publication Data

US 2024/0105431 A1 Mar. 28, 2024

Related U.S. Application Data

(63) Continuation of application No. PCT/EP2022/065203, filed on Jun. 3, 2022.

(30) Foreign Application Priority Data

Jun. 16, 2021 (DE) .................... 20 2021 103 238.3

(51) Int. Cl.
*H01J 37/32* (2006.01)

(52) U.S. Cl.
CPC .... *H01J 37/32926* (2013.01); *H01J 37/3299* (2013.01); *H01J 2237/327* (2013.01)

(58) Field of Classification Search
None
See application file for complete search history.

(56) References Cited

U.S. PATENT DOCUMENTS 5,444,259 A * 8/1995 Ohmi ................ H01J 37/32935 315/111.81
6,077,387 A * 6/2000 Tesauro .............. H10P 72/0421 216/60
9,397,011 B1 * 7/2016 Fang .................. C23C 16/4404
10,181,392 B2 1/2019 Leypold et al.
10,748,797 B2 * 8/2020 Bhatia ................. H10P 72/0604
11,447,868 B2 * 9/2022 Nguyen .................. C23C 16/46
11,961,711 B2 * 4/2024 De Chambrier .. H01J 37/32183
12,027,351 B2 * 7/2024 Savas ................ H01J 37/32082
12,198,896 B2 * 1/2025 Patrick .................. H01J 37/321
2003/0008507 A1 1/2003 Bell et al.

(Continued)

FOREIGN PATENT DOCUMENTS

DE 10208044 A1 9/2003
DE 102013110883 B3 1/2015

(Continued)

*Primary Examiner* — Srinivas Sathiraju
(74) *Attorney, Agent, or Firm* — LEYDIG, VOIT & MAYER, LTD.

(57) ABSTRACT

A signal processing system includes an acquisition device configured to acquire a repeating signal trace in a specified time interval. The signal trace varies as a function of a plasma process state of a plasma process. The signal processing system further includes a determining device configured to generate a data stream describing the plasma process, based on at least two signal traces acquired in one time interval each. The data stream contains a continuously determined stability indicator for the plasma process.

17 Claims, 2 Drawing Sheets

(56) References Cited

U.S. PATENT DOCUMENTS

2004/0061448 A1* 4/2004 Avoyan ............ H01J 37/32935 315/111.21
2004/0121603 A1* 6/2004 Chiu ................ H01J 37/32935 438/690
2005/0199341 A1* 9/2005 Delp ...................... H01J 37/32 156/345.24
2007/0051470 A1* 3/2007 Iwakoshi .......... H01J 37/32935 700/121
2007/0168143 A1 7/2007 Axenbeck et al.
2008/0021664 A1 1/2008 Krauss et al.
2008/0063810 A1* 3/2008 Park .................... C23C 16/4401 118/715
2010/0062547 A1* 3/2010 Hadidi ............. H01J 37/32935 118/712
2015/0048740 A1* 2/2015 Valcore, Jr. ......... H01J 37/3255 315/111.21
2016/0126069 A1* 5/2016 Kwon .................... H05B 31/26 315/111.21
2016/0299548 A1* 10/2016 Grede ..................... G06F 1/324
2016/0300695 A1* 10/2016 Alt .................... H01J 37/32174
2017/0105274 A1* 4/2017 Mann ................ H01J 37/32128
2018/0120889 A1* 5/2018 Grede ..................... G06F 1/022
2018/0138864 A1* 5/2018 Grede ............... H01J 37/32174
2018/0138869 A1* 5/2018 Grede ............... H01J 37/32174
2018/0323045 A1* 11/2018 Marion ............. H01J 37/32091
2020/0035470 A1* 1/2020 Ishizawa ........... H01J 37/32807
2021/0134563 A1* 5/2021 Bock ................ H01J 37/32165
2021/0183619 A1* 6/2021 Patrick .................. H01J 37/321
2021/0217587 A1* 7/2021 Savas ................ H01J 37/32082
2021/0225613 A1* 7/2021 Savas ................ H01J 37/32146
2021/0225614 A1* 7/2021 De Chambirier . H01J 37/32183
2022/0093429 A1* 3/2022 Chen ................. H01J 37/32972
2022/0406580 A1* 12/2022 Shinagawa ........... G06F 30/398
2022/0406581 A1* 12/2022 Guo .................. H01J 37/32944
2023/0109672 A1* 4/2023 Lim .................. H01J 37/32568 156/345.28
2024/0006155 A1* 1/2024 Maier ............... H01J 37/32183
2024/0105431 A1* 3/2024 Maier ............... H01J 37/32926
2024/0212980 A1* 6/2024 Kim ..................... H01J 37/3211

FOREIGN PATENT DOCUMENTS

EP 2905801 A1 8/2015
JP 2007173244 A 7/2007
JP 2007186725 A 7/2007
WO WO 0156072 A1 8/2001
WO WO 2020011668 A1 1/2020
WO WO 2020152097 A1 7/2020

* cited by examiner

SIGNAL PROCESSING SYSTEM AND POWER SUPPLY DEVICE HAVING A SIGNAL PROCESSING SYSTEM

CROSS REFERENCE TO RELATED APPLICATIONS

This application is a continuation of International Application No. PCT/EP2022/065203 (WO 2022/263209 A1), filed on Jun. 3, 2022, and claims benefit to German Patent Application No. DE 202021103238.3, filed on Jun. 16, 2021. The aforementioned applications are hereby incorporated by reference herein.

FIELD

Embodiments of the present invention relate to a signal processing system for determining and providing a data stream describing a plasma process. Embodiments of the present invention also relate to a power supply device having such a signal processing system.

BACKGROUND

In stable plasma processes in continuous wave mode, after the ignition of the plasma a constant load impedance (plasma impedance) is formed, which varies little. An automatic impedance matching network (matchbox) balances this impedance and presents its nominal impedance to the generator that generates the power to ignite and operate the plasma. However, if the plasma burns in an unstable manner, whether due to unfavourable chamber geometry, process chemistry, arcing, or the like, various stochastic processes cause the plasma impedance and thus the power coupled into the plasma to constantly vary.

A matchbox cannot compensate for this, causing a mismatch at the generator output/matchbox input. In the industrial application of RF generators and matchboxes, it is often assumed that a plasma is stable only if this system of generator, matchbox, plasma can be adjusted so that the reflected power is near zero. It has therefore become established in the industry that non-zero reflected power is equated with unstable plasma.

In plasma applications that vary with a certain repetition frequency, however, for example in modulated or pulsed plasma applications, reflected power is produced in principle due to transient and decay processes as well as ignition processes, e.g. at the beginning and end of each pulse. This can often not be compensated by matchboxes, because the changes in the plasma occur too rapidly for these devices. At high pulse frequencies or short duty cycles, this becomes significant. If each pulse has an identical curve shape for forward power Pi and reflected power Pr, or voltage and current, a stable process can still be assumed. The reflected power as a measure of the stability of the plasma therefore does not work here. In unstable plasma, however, it is possible that, for example, individual pulses do not ignite or the pulses differ from one another.

In other words, in plasma systems the magnitude of the mean reflected power is often used as an indicator of the quality of the matching process of an automatic matchbox and, at the same time, as a stability criterion for the plasma. In (fast) pulsed applications, oscillation and decay processes occur at the beginning and end of each pulse, resulting in reflected power despite a stable plasma process and the best-possible matching.

SUMMARY

Embodiments of the present invention provide a signal processing system. The signal processing system includes an acquisition device configured to acquire a repeating signal trace in a specified time interval. The signal trace varies as a function of a plasma process state of a plasma process. The signal processing system further includes a determining device configured to generate a data stream describing the plasma process, based on at least two signal traces acquired in one time interval each. The data stream contains a continuously determined stability indicator for the plasma process.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
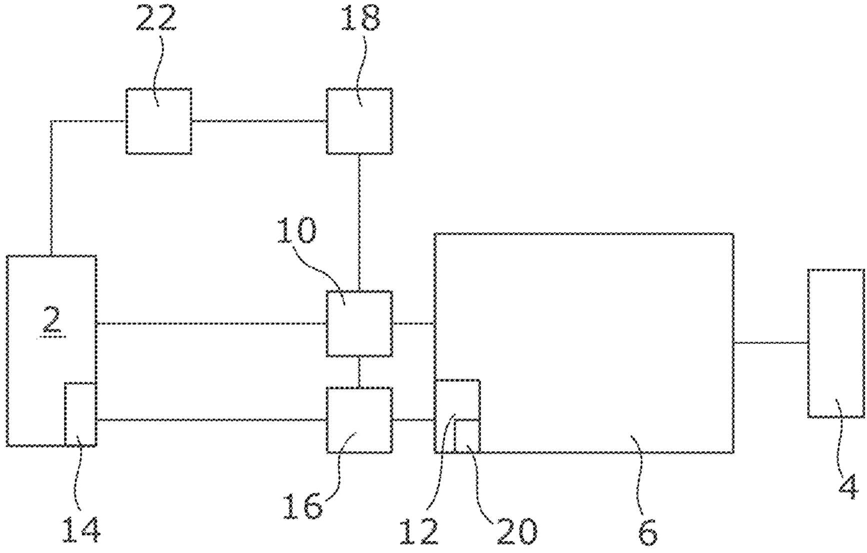
FIG. 1 shows a schematic illustration of a power supply device according to some embodiments.
Figure 1:

Embodiments of the invention provide a device for determining a characteristic value that describes the stability of the plasma more reliably.

According to embodiments of the invention, a signal processing system for determining and providing a data stream describing a plasma process, comprising a) an acquisition device, which is configured to acquire a signal trace that repeats in a specified time interval, wherein said signal trace varies as a function of the plasma process state, b) a determining device, which is configured to generate the data stream based on at least two signal traces acquired in one time interval each, wherein the data stream contains a continuously determined stability indicator for the plasma process.

A signal trace refers to the path of a signal proportional to an envelope curve, to an effective value curve, to a root mean squared (RMS) curve, or to an extreme value curve of an MF or RF signal, or to the curve of a DC signal that can vary continuously.

The stability indicator can be dependent on the reflected power on the one hand, but also dependent on other parameters, i.e. it may not be exclusively dependent on the reflected power. Furthermore, the stability indicator can be independent of the reflected power and in particular reach its maximum, even if the reflected power is not equal to zero. With the stability indicator determined according to the invention, a more informative statement as to the stability of the plasma can be made.

The data stream is a continuous supply of constantly updated data, in particular stability indicators.

The data stream can be structured in such a way that updated data on the stability indicator are always output after a specified data stream interval. The data stream interval can be independent of the specified time interval of the repeating signal trace. In particular, the data stream interval may be greater than the time interval of the repeating signal trace. The data stream interval can range from approximately 1 ms to approximately 1 s. It can be made available to a higher-level plasma process control unit. The higher-level plasma process control unit can be configured to incorporate this stability indicator in its process improvement control system and to adjust, for example, gas supply, gas mixture, pressure, electrical parameters such as frequency, power, voltage, current, modulation or pulse frequency such that the stability indicator has a more favourable value.

The data stream can be generated by comparing the at least two signal traces acquired in one time interval each. For example, this comparison can be a correlation or a subtraction.

An output value of the data stream, i.e. such a stability index, can be based on multiple such comparisons with multiple acquired signal traces.

The stability indicator can be determined as a statistical value, e.g. a mean or a maximum value from multiple such comparisons.

Multiple data streams with multiple different stability indicators can be determined according to different statistical evaluations.

Rare events, but ones that are very pronounced, can be detected, for example, from a high maximum value and low mean value.

The stability indicators determined can be used alone and/or in combination with other data for AI (artificial intelligence) applications and/or machine learning as both test and training data, thus making the processes even more stable.

The generation of the data stream can be configured such that a time window used for determining the stability indicator is at least as long as the data stream interval, but preferably longer than this, in particular at least twice as long. This prevents the loss of information.

The stability indicator(s) can be used very advantageously for regulating a plasma process which has a basic instability due, for example, to an unstable load or environmental conditions. For example, a baseline instability can be determined from the one or more stability indicator(s), and an attempt is made to keep the process in this baseline instability and to use the stability indicator(s) to identify when the process instability arrives at a new value that deviates from the baseline instability, and if this altered instability is undesirable, take action to return to the baseline instability.

The acquisition device may have an analogue-to-digital converter (ADC) and store data in a memory. All data of a time interval can be stored in a first memory section (array), and the data of a subsequent time interval in a further memory section. More than two such memory sections may be provided. When the last memory section is written to, the next step can be writing to the first memory section again and overwriting the data there.

This can all be performed by the acquisition device. The acquisition device can have a hard-wired or programmable logic module, in particular an FPGA. This has the advantage that fast data processing is possible. The same routines can always be executed. Another advantage is the configurability of an FPGA.

The determining device may be configured for read access to the memory sections, in particular always to the memory sections that are not currently being written to by the acquisition device. The determining device can be configured as a microprocessor, or comprise one. A microprocessor can be configured to perform other tasks of a controller.

Preferably, the plasma process is excited by an RF power signal. The signal trace may be repeating. In particular, the signal trace can repeat periodically with a signal trace frequency. The signal trace can be repeated with the period of the time interval in normal operation, e.g. a periodically modulated signal, or a periodically pulsed signal or a combination of these repeating signal traces.

The RF power signal can have a significantly higher frequency than the signal trace frequency, typically a frequency higher by a factor of 4, 10, 50, 100 or more. The RF power signal can be at frequencies greater than or equal to 4 MHz, in particular at frequencies that are also less than or equal to 80 MHz, in particular in the frequency range from 10 to 50 MHz, preferably at 13.56 MHz.

The frequency of the repeating signal trace (=signal trace frequency) can be greater than or equal to 10 kHz. The frequency of the repeating signal trace (=signal trace frequency) can be less than or equal to 500 kHz. It may be generated by modulated or pulsed operation of the RF power signal. It may be generated by a modulated or pulsed operation of another power supply which is also connected to the plasma process, e.g. a bias power supply. It may be generated by a periodic change in an impedance matching arrangement. It may be generated by a periodic change in the plasma process. This may be a movement of the substrate in the plasma process, e.g. the substrate feed, or the movement of multiple substrates on a turntable.

The signal trace can be a substantially constant value. For example, it can be a constant RF power signal from the power generator to a plasma process with a turntable described above with a rotational speed of 1 rotation in 10 s. Then the RF power signal would be essentially constant, but the process operator knows that there is an influencing variable that repeats itself with a time interval of 10 s. This time interval could be determined in advance.

The predetermined time interval of the repeating signal trace and/or the data stream interval may be determined by process fluctuations of the plasma process. Such process fluctuations may be caused by one or more gaps between multiple substrates, e.g. in a continuous coating plant or in a plant with rotating targets or rotating substrates due to unevenness or irregularities in these devices. Plants of this kind and reasons for such process fluctuations are described, for example, in WO2020/152097 A1 with the title "Method for compensating for process fluctuations in a plasma process and closed-loop controller for a power generator for supplying a plasma process".

The signal processing system may be configured such that the time interval can be specified externally, e.g. by a power generator, an impedance matching arrangement or by another unit influencing the plasma process, such as a low-frequency, modulated or pulsed additional power supply connected to the plasma process, in particular a bias power supply. The time interval can also be determined by the feed rate or rotation speed of the substrate in the plasma or plasma chamber.

The signal processing system can be configured to determine the time interval itself, in particular by means of the acquisition device or the determining device. This can be effected, for example, by autocorrelation, i.e. by correlation of the signal trace with the signal trace itself at an earlier point in time. Alternatively, the time interval could be determined by frequency analysis, e.g. by searching for frequencies unequal to, in particular lower than, the excitation frequency of the plasma process.

The signal processing system may be configured such that the data stream is generated based on a comparison of two signal traces of consecutive time intervals. The consecutive time intervals do not necessarily need to be directly consecutive time intervals. It is also possible to compare multiple first signal traces of multiple first time intervals with a signal trace of a subsequent time interval and use the result to generate the data stream. For example, a mean-value trace or a maximum-value trace can be formed from multiple first signal traces of multiple first time intervals, and this can be used for the comparison.

The signal processing system can comprise a memory device for recording the signal traces. This makes it possible to compare signal traces and/or values derived from them with one another. Averaging is also possible. It is also possible to generate envelope curves. For each time interval, extreme values of the signal trace can be determined and stored. The memory device can be implemented as a ring buffer.

A synchronization device can be provided for synchronizing the acquisition device to the signal trace frequency. This makes it possible to record and compare entire signal traces, pulses or pulse onsets. Alternatively, multiple process starts and ignition processes could be recorded. This is advantageous when a process tends not to ignite or to go into a "bad" state at start-up.

A comparison device may be provided, which is configured to compare recorded signal traces and/or values derived from them with one another or with a reference.

The determining device may be configured to determine a mean signal trace over multiple time intervals. This allows a mean signal trace to be determined. Each new signal trace is input into the mean signal trace appropriately weighted. The acquisition device may be designed to determine, in particular simultaneously, how far the new signal trace deviates from the mean signal trace, in particular to determine a deviation of a sample of a signal trace from a mean signal trace. The maximum of this deviation or its mean value can then be used as a measure of the (in)stability. This value is recorded for the N time intervals and the maximum value of these or the mean value is output. Without recording, an extreme value could also be used, which decays with each new time interval until it reaches zero after N time intervals.

The determining device can be configured to determine an envelope, in particular the minimum and maximum values of the corresponding samples of multiple time intervals, and from this to determine a stability indicator. For example, N pulses can be recorded. When the (N+1)th pulse is detected, the oldest pulse is overwritten again (ring buffer). From all of these pulses in the ring buffer the maximum and minimum values for each sample are determined. This results in an envelope of maximum and minimum values. By forming the mean distance from the maximum and minimum values, another measure of the instability can also be determined.

In order to save resources, it is not necessary to record every signal trace in a time interval. Individual time intervals can also be omitted during the determination.

In one aspect, the invention relates to a power supply device for generating an electrical high-frequency power signal (RF power signal) for a plasma, having a power generator, an impedance matching arrangement connected to the power generator, and having a signal processing system according to the invention.

The signal processing system may be arranged in the power supply device. Alternatively, it may be arranged in the impedance matching arrangement. Furthermore, it is conceivable for it to be arranged externally, i.e. neither in the power supply device nor in the impedance matching arrangement.

Further advantages of the invention are derived from the description and the drawing. Similarly, according to the invention, the features mentioned above and those yet to be explained further may be used in each case individually or together in any desired combinations. The embodiments shown and described should not be understood as an exhaustive enumeration, but rather are of an exemplary character for outlining the invention.

FIG. 1 shows a power supply device 1 for generating an in particular pulsed, electrical high-frequency power signal for generating a plasma in a plasma chamber 4. The power supply device 1 comprises a power generator 2 and an impedance matching arrangement 6 connected to the power generator 2, via which the power generator 2 is connected to the plasma chamber 4.

An acquisition device 10 is configured to acquire a signal trace that repeats in a specified time interval, wherein said signal trace varies as a function of the plasma process state. The acquisition device 10 is arranged between the power generator 2 and the impedance matching arrangement 6. It may be designed, for example, as a measuring device for measuring current and/or voltage, or as a directional coupler to detect a power.

An acquisition device 12, 14 may be arranged in the power generator 2 or the impedance matching arrangement 6 (two acquisition devices 12, 14 are shown, but one is sufficient). It is also conceivable that the acquisition device 12, 14 is arranged elsewhere. It is configured to generate a data stream based on at least one signal trace acquired in a time interval, wherein the data stream contains a continuously determined stability indicator for the plasma process.

The signal traces acquired by the acquisition device 10 can be stored in a memory device 16 and from there provided to the acquisition device 12, 14. The memory device 16 can be implemented as a ring buffer.

The comparison of the recorded signal traces and/or values determined from them with one another or with reference values can be carried out by a comparison device 20. By means of the comparison, a data stream that includes a stability indicator can be generated and output, in particular displayed to a user.

The acquisition of the signal traces can be synchronized. For synchronizing the acquisition of the signal traces a synchronization device 18 is provided, which can be connected to both the acquisition device 10 and to a controller 22. The controller 22 can control both the power generator 2 and the synchronization device 18.

Figure 2:
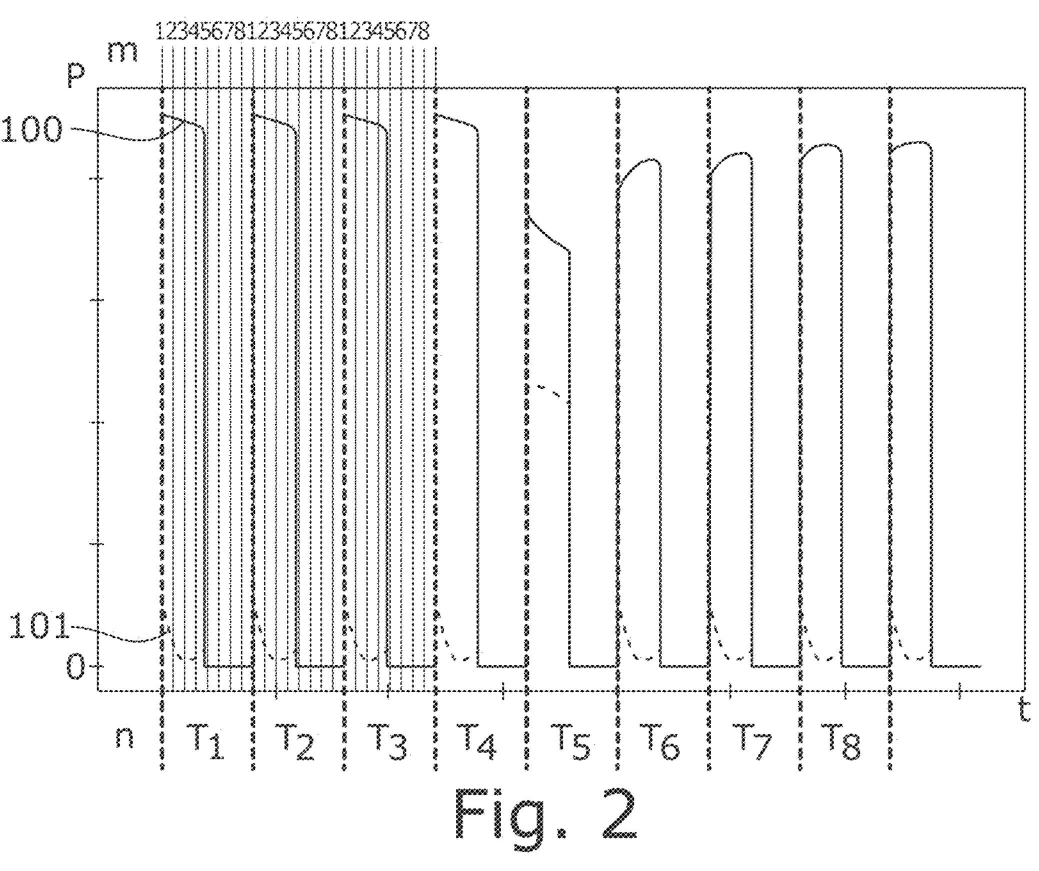
FIG. 2 shows a diagram illustrating a first procedure for determining a data stream with a stability index according to some embodiments.

FIG. 2 shows a first signal trace 100 corresponding to a pulsed radio-frequency power, which is supplied by the power generator 2, and a second signal trace 101 corresponding to a reflected power. The signal traces 100, 101 are acquired in the time intervals n=T1 . . . T8 and stored in the memory device 16. In each time interval n=T1 . . . T8, m=1 . . . 8 samples are taken from the signal traces 100, 101.

FIG. 2 shows a pulsed RF signal, a pulsed DC bias signal or similar signal. The envelope of the pulsed signal can be seen. This can have a frequency from e.g. 10 kHz up to 500 kHz. An RF signal that is pulsed with this pulse shape has a significantly higher frequency, e.g. 10 MHz or more. It is not shown in FIG. 2.

In the time intervals T1-T4, the signal traces 100, 101 are normal. In the time interval T5, there is a discontinuity in the form of a pulse dropout or an unwanted event. The time intervals T6-T8 correspond to a recovery phase.

It can be seen that the time intervals T1 . . . T8 are synchronized to the rising edge of a pulse of the RF power signal, i.e. the acquisition of the signal traces 100, 101 is synchronized by the synchronization device 18 to the pulsed signal, which causes the pulsing of the RF power signal.

The determining device 12, 14, for example, forms the sliding average of the signal trace 100 over n time intervals, so that a mean signal trace is derived. Each new time interval is input into the mean signal trace appropriately weighted. It also determines how far each sample of the new time interval deviates from the mean signal trace. The maximum of this deviation or its mean value can then be used as a measure of the stability of the plasma process. Alternatively, the cross-correlation between the new time interval and the mean value can be used. This stability indicator can be recorded for the n time intervals and the maximum value or mean value thereof can be output. This represents the data stream described above.

Alternatively, only the temporally corresponding sampling points (samples) of two time intervals can be compared, e.g. by subtraction, and a maximum value can be stored. This maximum value decays with each new time interval, unless a discontinuity occurs, until it reaches zero after N time intervals.

Accordingly, for the time intervals T1-T4, a stability indicator would be determined and output which would be associated with a high stability since the samples deviate little from a mean signal trace, while for the time intervals T5-T8 a stability indicator would be determined and, if appropriate, output, which would be associated with a low stability.

Figure 3:
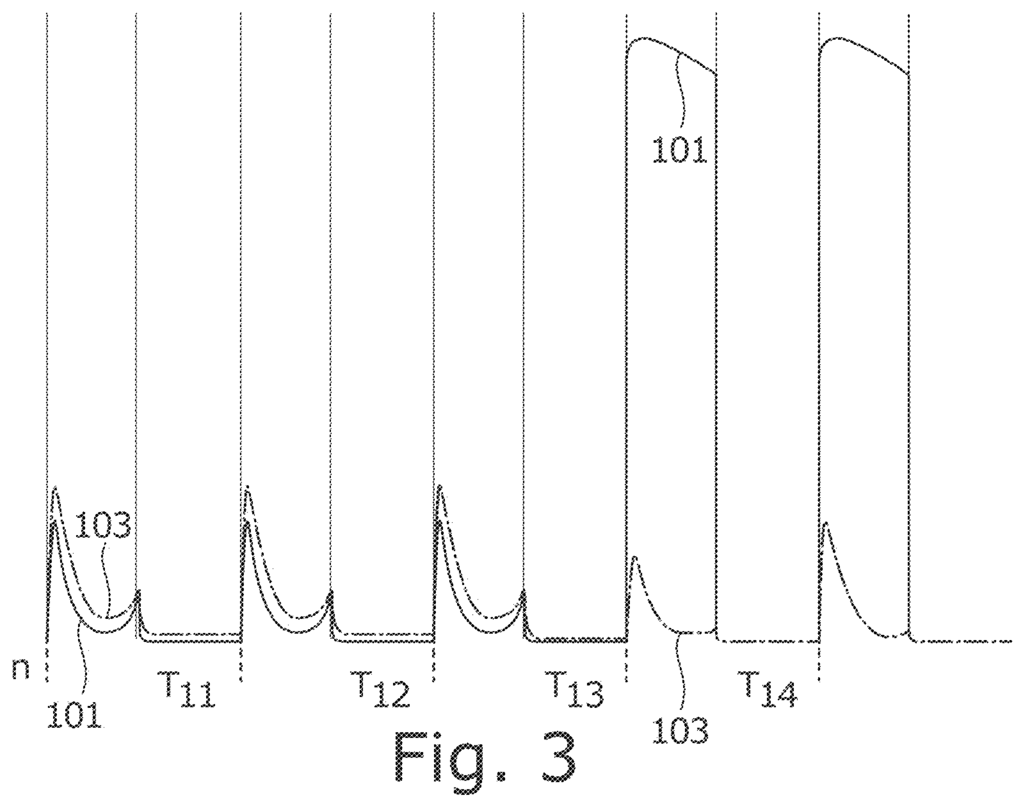
FIG. 3 shows a diagram illustrating a second procedure for determining a data stream with a stability index according to some embodiments.

In the embodiment according to FIG. 3, the signal trace 101 is shown again. The signal trace 101 was acquired in the time intervals n=T11 . . . T14 and stored in the memory device 16. In each time interval n=T11 . . . T14, multiple samples are taken from the signal trace.

It can be seen that the time intervals T11 . . . T14 are synchronized to the rising edge of a pulse of the RF power signal, i.e. the acquisition of the signal trace 101 is synchronized by the synchronization device 18 to the pulsed signal, which causes the pulsing of the RF power signal.

For each sample, a maximum value and a minimum value are formed over the time intervals, so that an envelope 103 can be generated. For example, a stability indicator can be determined from the mean value, the maximum and minimum value of corresponding samples of the time intervals. Therefore, if the envelope 103 is a close fit to the signal trace 101, as in the intervals T11-T13, there is high stability. Accordingly, for the time intervals T11-T13 a stability indicator would be determined and output, which would be associated with a high stability. If the envelope is a large distance from the signal curve 101, as in interval T14, there is low stability. Accordingly, for the time interval T14 a stability indicator would be determined and output, which would be associated with a lower stability.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A signal processing system comprising an acquisition device configured to acquire a repeating signal trace in a specified time interval, wherein the signal trace varies as a function of a plasma process state of a plasma process comprising a pulsed radio-frequency (RF) power signal, a synchronization device configured to synchronize the acquisition device to a signal trace frequency such that the specified time interval is synchronized to a pulse of the pulsed RF power signal; and a determining device configured to generate a data stream describing the plasma process, based on at least two signal traces acquired in one time interval each, wherein the data stream contains a continuously determined stability indicator for the plasma process, wherein the specified time interval of the repeating signal trace and/or a data stream interval are predetermined by process fluctuations of the plasma process, wherein the data stream is generated based on a comparison of the at least two acquired signal traces, wherein the determining device is configured to generate and output to a user the data stream including the stability indicator, and wherein a value of the stability indicator is based on a distance of a respective signal trace of the at least two acquired signal traces in comparison to one of: a mean value, a maximum value, or a minimum value of an acquired signal trace of the at least two acquired signal traces acquired over a previous time interval.

2. The signal processing system according to claim 1, wherein the time interval is specified externally.

3. The signal processing system according to claim 1, wherein the time interval is determined internally by the signal processing system, using the acquisition device or the determining device.

4. The signal processing system according to claim 1, wherein the data stream is generated based on a comparison of the at least two signal traces of consecutive time intervals.

5. The signal processing system according to claim 4, wherein the stability indicator is determined based on a plurality of the comparisons with a plurality of acquired signal traces.

6. The signal processing system according to claim 5, wherein the stability indicator is determined as a mean value or a maximum value, from the plurality of comparisons.

7. The signal processing system according to claim 1, wherein the determining device is configured to generate multiple data streams with multiple different stability indicators determined according to different statistical evaluations.

8. The signal processing system according to claim 7, wherein the determined stability indicators are used alone or in combination with other data for machine learning, as test data and as training data.

9. The signal processing system according to claim 1, wherein, for generating the data stream, a time window used for determining the stability indicator is at least as long as a data stream interval.

10. The signal processing system according to claim 1, further comprising a memory device for recording the signal traces.

11. The signal processing system according to claim 10, wherein the memory device is configured as a ring buffer.

12. The signal processing system according to claim 1, further comprising a comparison device configured to compare recorded signal traces, and/or to compare values determined from the recorded signal traces, with one another or with a reference.

13. The signal processing system according to claim 1, wherein the determining device is configured to determine a mean signal trace over multiple time intervals.

14. The signal processing system according to claim 1, wherein the determining device is configured to determine a deviation of a sample of a signal trace from a mean signal trace.

15. The signal processing system according to claim 1, wherein the determining device is configured to determine an envelope, including minimum and maximum values of corresponding samples of multiple time intervals, and wherein the stability indicator is determined from the minimum and maximum values.

16. A power supply device for generating a pulsed electrical high-frequency power signal for a plasma, comprising a power generator, an impedance matching arrangement connected to the power generator, and the signal processing system according to claim 1.

17. A process control arrangement for a plasma process, configured to use the stability indicator from the signal processing system of claim 1 for controlling the plasma process.

* * * * *